United States Patent [19]

Mitoh et al.

[11] Patent Number: 5,573,843
[45] Date of Patent: Nov. 12, 1996

[54] FIBER-REINFORCED PLASTIC COMPOSITE MATERIAL FOR FASTENING PALLETS AND PROCESS FOR PRODUCING THE SAME

[75] Inventors: Yutaka Mitoh; Noaya Fujiwara, both of Kobe, Japan

[73] Assignee: Kabushiki Kaisha Kobe Seiko Sho, Kobe, Japan

[21] Appl. No.: 279,844

[22] Filed: Jul. 26, 1994

[30] Foreign Application Priority Data

Aug. 5, 1993 [JP] Japan .................................. 5-194827

[51] Int. Cl.$^6$ ................................................ B32B 5/16
[52] U.S. Cl. ..................... 428/240; 428/224; 428/232; 428/242; 428/245; 428/931; 428/327; 428/328; 428/330
[58] Field of Search ...................... 428/327, 224, 428/232, 240, 242, 245, 931, 327, 328, 330

[56] References Cited

U.S. PATENT DOCUMENTS 4,944,998  7/1990  Ko et al. .................................. 428/327

*Primary Examiner*—Patrick Ryan
*Assistant Examiner*—Rich Weisberger
*Attorney, Agent, or Firm*—Oblon, Spivak, McClelland, Maier, Neustadt, P.C.

[57] ABSTRACT

Disclosed herein is a fiber-reinforced plastic composite material for fastening pallets to be used to transfer printed circuit boards for automatic soldering. The composite material is composed of a thermosetting resin, reinforcing long fibers, and a light-colored electrically conductive filler. The pallets are formed from the composite material by heating and pressing. The pallets have high electrical conductivity to prevent static build-up, a light color which permits coloring, and good mechanical properties.

4 Claims, No Drawings

5,573,843

FIBER-REINFORCED PLASTIC COMPOSITE MATERIAL FOR FASTENING PALLETS AND PROCESS FOR PRODUCING THE SAME

BACKGROUND OF THE INVENTION

1. Field of the Invention

The present invention relates to a fiber-reinforced plastic composite material for fastening pallets to be used to transfer printed circuit boards and also to a process for producing the same. The composite material has high mechanical strength, good antistatic property, good heat resistance, and good machinability. It can be colored in any light color.

2. Description of the Prior Art

The mounting of semiconductor parts on a printed circuit board is usually accomplished by means of an automatic soldering machine. For semiconductor parts to be placed at right soldering positions, it is necessary to carry the printed circuit board to a desired position in the machine, to stop it there, and fix it there accurately, without causing warpage. A known way to accomplish this is to transfer a printed circuit board by the aid of a pallet to which it is fastened. (See Japanese Patent Publication No. 20786/1980.)

This type of fastening pallet for transfer is usually made of a metal frame (of stainless steel, aluminum, or titanium) and a means to secure a printed circuit board. Being of general-purpose type, it can be applied to a large variety of printed circuit boards but, on the other hand, it needs fine adjustment for fastening position according to the specific printed circuit board to be transferred. This adjustment is troublesome and inefficient. In addition, the recent trend toward the miniaturization and weight reduction of electronic machines and equipment has evoked the need for printed circuit boards of varied shapes and for flexible printed circuit boards. Under these circumstances, it turned out the conventional general-purpose fastening pallets do not meet requirements for efficient operation.

To cope with this situation, there has been proposed a new fastening pallet that can be applied to flexible printed circuit boards efficiently. It is made of metal plate formed in conformity with the configuration of a particular printed circuit board. (See Japanese Patent Laid-open No. 54991/1990.) However, this pallet suffers the disadvantage of being heavy and having a high thermal conductivity (because it is made of metal). Thus, it easily gets hot during soldering, which causes the sticking of solder.

To solve this problem, there has been proposed a fastening pallet of special-purpose type which is made of fiber-reinforced plastic laminate formed in conformity with a particular printed circuit board. This laminate is prepared by heating and pressing from a half-cured prepreg of nonwoven fabric of glass fiber impregnated with an epoxy resin. The fastening pallet of this kind, however, has the disadvantage that the composite resin is subject to deterioration due to heat to which it is exposed repeatedly during its use and this deterioration leads to delamination.

Moreover, the fastening pallet made of plastic composite material is liable to accumulate static charge during soldering, and there is an extreme case in which the accumulated static charge breaks electronic parts on the printed circuit board. To avoid this trouble, an attempt has been made to incorporate the composite material with carbon black, thereby rendering the composite material electrically conductive (about $10^7$ $\Omega/\square$) and permitting the leakage of static charge.

Unfortunately, carbon black incorporated into the plastic composite material falls off or fouls electronic parts (resulting in short-circuiting) when rubbed during use. In addition, carbon black makes the pallet black and the black color brings about heat loss at the time of heating and prevent the coloring for good appearance.

There is another way of rendering the plastic composite material electrically conductive by incorporating it with metal fiber or metal powder. (See Japanese Patent Laid-open No. 31346/1991.) Metal fiber does not disperse uniformly when the composite material undergoes laminate forming. This leads to uneven electrical conductivity. Metal powder is liable to precipitate (due to its higher specific gravity) and hence does not distribute uniformly. This also leads to uneven electrical conductivity. Moreover, metal powder involves the danger of dust explosion in the manufacturing process.

SUMMARY OF THE INVENTION

The present invention was completed to address the above-mentioned problems. It is an object of the present invention to provide a fiber-reinforced plastic composite material for fastening pallets which have uniform electrical conductivity, good heat resistance, good mechanical properties, and good resistance to delamination. The composite material itself has a light color and is capable of being colored and formed as desired.

DESCRIPTION OF THE PREFERRED EMBODIMENTS

The gist of the present invention resides in a fiber-reinforced plastic composite material for fastening pallets to be used to transfer printed circuit boards, said composite material being a thermosetting resin incorporated with reinforcing long fibers and a light-colored electrically conductive filler. The plastic composite material is produced by impregnating a laminate of reinforcing long fibers with a thermosetting resin liquid in which is dispersed a light-colored electrically conductive filler, followed by heating and pressing.

According to the present invention, the plastic composite material is composed of reinforcing long fibers and a thermosetting resin in which is uniformly dispersed a light-colored electrically conductive filler. The long fibers are responsible for high strength and the uniformly dispersed filler is responsible for uniform conductivity and antistatic property. Being held in the interstices of the long fibers, the filler does not fall off due to rubbing. The filler imparts good heat resistance to the composite material. The light-colored filler permits the composite material to be colored with a pigment or dye of desired color. The composite material is capable of machining into any shape according to printed circuit boards to be transferred. The fastening pallets can be adapted to printed circuit boards of any shape for their transfer and fixing.

The reinforcing long fibers used in the present invention are not specifically limited in their kind. Their preferred examples include inorganic long fibers (such as glass fibers) and heat-resistant organic long fibers (such as aramid fibers). They may be used alone or in combination with one another. They may be used in the form of nonwoven fabric, woven fabric, or knitted fabric.

The light-colored electrically conductive filler is not specifically limited in kind. It includes, for example, zinc oxide, titanium oxide, and potassium titanate whisker or powder.

They are commercially available under the trade name of "Pastran" (from Mitsui Mining and Smelting Co., Ltd.), "Dentol" (from Otsuka Chemical Co., Ltd.), "Panatetra" (from Matsushita Amtec Co., Ltd.), "W-1-P" and "W-1" (from Mitsubishi Material Co., Ltd.), and "Taipaig FT-1000" and "Taipaig ET-500W" (from Ishihara Sangyo Kaisha, Ltd.). They may be used alone or in combination with one another. They may also be used in combination with a non-conductive filler (such as talc, kaolin, mica, glass flake, and titanium oxide) in an amount not harmful to electrical conductivity, to facilitate impregnation and workability.

The light-colored electrically conductive filler should preferably be finer than 20 μm in diameter so that it is dispersed uniformly into the resin. The filler is not specifically limited in shape; however, an elongated shape (with a great aspect ratio) is preferable to a spherical shape from the standpoint of ability to impart electrical conductivity.

According to the present invention, the matrix resin should be a thermosetting resin which is a low-viscosity liquid before curing (so that it is easily impregnated into reinforcing long fibers) and becomes solid by curing upon heating and pressing after impregnation. The matrix resin should have sufficient heat resistance so that the fastening pallets made from it are not deformed by heat of molten solder with which they come into direct contact. A preferred matrix resin is one which has a glass transition point higher than 150° C. after curing. The formulation of the matrix resin should be established so that these conditions are met. For example, the matrix resin may be composed of an epoxy resin and an acid anhydride hardener. The epoxy resin includes bisphenol A type epoxy resin, bisphenol F type epoxy resin, bisphenol S type epoxy resin, phenol novolak type epoxy resin, polyfunctional glycidylamine type epoxy resin, polyfunctional glycidylether type epoxy resin, and alicyclic epoxy resin. The hardener includes methylnadic acid anhydride, methylhexahydrophthalic anhydride, and methyltetrahydrophthalic anhydride. They may be used alone or in combination with one another.

Preferable among these examples are bisphenol A type epoxy resin (or phenol novolak type epoxy resin) and methylnadic acid anhydride. The hardener may be used in combination with a proper amount of cure accelerator such as dimethylbenzineamine, 2-ethyl-4-methylimidazole, and 1-butyl-2-methylimidazole.

The amount of the reinforcing long fibers in the plastic composite material should be 50–80 wt %, preferably 60–75 wt %. An amount less than 50 wt % is not enough for sufficient reinforcement; and an amount in excess of 80 wt % leads to poor impregnation and a shortage of resin to hold the fibers and filler.

The adequate amount of the electrically conductive filler varies depending on its kind, shape, and particle diameter. It is usually 5–90 parts by weight, preferably 10–50 parts by weight, for 100 parts by weight of the resin, so that the filler imparts uniform, stable electrical conductivity to the composite material without adverse effect on impregnation and any possibility of falling off. It was found that the adequate amount of commercially available conductive fillers is as follows:
"Dentol" . . . about 10 parts by weight
"Panatetra" . . . about 30 parts by weight
"W-1-P" . . . about 90 parts by weight The plastic composite material of the present invention is prepared by impregnating a laminate of mats (in the form of nonwoven or woven fabric of reinforcing long fibers) with a thermosetting resin liquid in which is dispersed an adequate amount of the electrically conductive filler, and then pressing and heating the impregnated laminate into a desired shape. During impregnation, the filler is evenly dispersed into the interstices of the reinforcing long fibers without the possibility of settling due to difference in specific gravity. Thus there is obtained the desired composite material which has uniform physical properties and electrical conductivity.

The thus obtained plastic composite material is composed of a thermosetting resin matrix, particles of electrically conductive filler dispersed in the resin matrix, and reinforcing long fibers impregnated with the resin matrix. It has high strength as well as uniform electrical conductivity. It does not permit the filler to fall off when rubbed. It is not subject to delamination. It can be easily machined into a desired shape in conformity to the shape and structure of the printed circuit board to be transferred. Being made of a light-colored material, it suffers less heat loss than the black material at the time of heating and it can be colored in any desired color (for aesthetic purpose) by incorporation with an adequate colorant.

EXAMPLES

The following examples are included merely to aid in the understanding of the invention, and variations may be made by one skilled in the art without departing from the spirit and scope of the invention. Unless otherwise stated, quantities are expressed as parts by weight.

The performance of the molded product was evaluated according to the following methods.

Glass transition point: measured using a differential scanning calorimeter, Model DSC7 (Perkin-Elmer), with the temperature increasing at a rate of 10° C./min.

Electrical conductivity: evaluated in terms of surface resistivity measured using "Hirester IP" made by Mitsubishi Petrochemical Co., Ltd.

Heat resistance: by visual observation after immersion in a soldering bath at 300° C. for 10 minutes. Rated as "good" (no change) and "poor" (delamination due to thermal decomposition).

Color: visual observation.

EXAMPLE 1

A resin liquid was prepared by uniform mixing from the following components.

Epoxy resin ("DER331" from Dow Chemical) . . . 75 parts
Epoxy resin ("Tetrad-C" from Mitsubishi Gas Chemical) . . . 25 parts
Acid anhydride hardener ("Kayahard MCD" from Nippon Kayaku) . . . 105 parts
Cure accelerator ("2E4MZ" (2-ethyl-4-methylimidazole) from Shikoku Kasei) . . . 1 part
Electrically conductive filler ("Dentol WK-208" from Otsuka Chemical) . . . 10 parts
Titanium oxide . . . 5 parts The resin liquid was impregnated into a laminate of nonwoven fabrics of glass fiber, with the ratio of the former to the latter being 20:80 by weight. The impregnated laminate was pressed at 160° C. for 10 minutes using a hot press to give a molded product. Upon curing at 160° C. for 10 minutes, the resin composition used in this example gave a cured product having a glass transition point of 185° C., which is an indication of sufficient heat resistance required of the matrix resin for fastening pallets.

The resulting molded product assumed a light grayish color. It had a surface resistivity of $2\times10^5$ $\Omega/\square$, indicating that it has electrical conductivity high enough to prevent static build-up. Flexural tests indicated that the molded product has a flexural strength of 37.7 kg/mm$^2$ and a flexural modulus of 1966 kg/mm$^2$. A test piece (5 cm square) cut out of the molded product remained intact without delamination when immersed in a soldering bath at 300° C. for 10 minutes. The molded product was fabricated into a fastening pallet by machining in conformity with a printed circuit board, and the pallet was used for the automatic soldering of the printed circuit board. It was possible to carry out satisfactory soldering.

EXAMPLE 2

The resin liquid prepared in Example 1 was further incorporated with 30 parts of "Panatetra" and 5 parts of titanium oxide as electrically conductive fillers. The resin liquid was impregnated into a laminate of nonwoven fabrics of glass fiber, with the ratio of the former to the latter being 30:70 by weight. The impregnated laminate was pressed at 160° C. for 10 minutes using a hot press to give a molded product. The molded product assumed a white color. It had a surface resistivity of $8\times10^5$ $\Omega/\square$, indicating that it has electrical conductivity high enough to prevent static build-up. Flexural tests indicated that the molded product has a flexural strength of 33.8 kg/mm$^2$ and a flexural modulus of 1850 kg/mm$^2$. A test piece (5 cm square) cut out of the molded product remained intact without delamination (due to thermal decomposition) when immersed in a soldering bath at 300° C. for 10 minutes.

EXAMPLE 3

The resin liquid prepared in Example 1 was further incorporated with 90 parts of "W-1-P" as an electrically conductive filler. The resin liquid was impregnated into a laminate of nonwoven fabrics of glass fiber, with the ratio of the former to the latter being 40:60 by weight. The impregnated laminate was pressed at 160° C. for 10 minutes using a hot press to give a molded product. The molded product assumed a blue color. It had a surface resistivity of $8\times10^5$ $\Omega/\square$, indicating that it has electrical conductivity high enough to prevent static build-up. Flexural tests indicated that the molded product has a flexural strength of 29.9 kg/mm$^2$ and a flexural modulus of 1722 kg/mm$^2$. A test piece (5 cm square) cut out of the molded product remained intact without delamination (due to thermal decomposition) when immersed in a soldering bath at 300° C. for 10 minutes.

COMPARATIVE EXAMPLE 1

The resin liquid prepared in Example 1 was further incorporated with 30 parts of carbon black and 20 parts of titanium oxide as electrically conductive fillers. The resin liquid was impregnated into a laminate of nonwoven fabrics of glass fiber, with the ratio of the former to the latter being 30:70 by weight. The impregnated laminate was pressed at 160° C. for 10 minutes using a hot press to give a molded product. The molded product assumed a black color. It had a surface resistivity of $1\times10^5$ $\Omega/\square$, indicating that it has electrical conductivity high enough to prevent static build-up. Flexural tests indicated that the molded product has a flexural strength of 34.7 kg/mm$^2$ and a flexural modulus of 1866 kg/mm$^2$. A test piece (5 cm square) cut out of the molded product remained intact without delamination (due to thermal decomposition) when immersed in a soldering bath at 300° C. for 10 minutes.

COMPARATIVE EXAMPLE 2

The resin liquid prepared in Example 1 was further incorporated with 1 part of carbon black and 30 parts of titanium oxide as electrically conductive fillers. The resin liquid was impregnated into a laminate of nonwoven fabrics of glass fiber, with the ratio of the former to the latter being 40:60 by weight. The impregnated laminate was pressed at 160° C. for 10 minutes using a hot press to give a molded product. The molded product assumed a blackish gray color (which is more desirable than the color in Comparative Example 1). It had a surface resistivity of $7\times10^8$ $\Omega/\square$, indicating that it does not have electrical conductivity high enough to prevent static build-up. Flexural tests indicated that the molded product has a flexural strength of 24.6 kg/mm$^2$ and a flexural modulus of 1480 kg/mm$^2$. A test piece (5 cm square) cut out of the molded product remained intact without delamination (due to thermal decomposition) when immersed in a soldering bath at 300° C. for 10 minutes.

COMPARATIVE EXAMPLE 3

The resin liquid prepared in Example 1 was further incorporated with 5 parts of iron powder as an electrically conductive filler. The resin liquid was impregnated into a laminate of nonwoven fabrics of glass fiber, with the ratio of the former to the latter being 30:70 by weight. The impregnated laminate was pressed at 160° C. for 10 minutes using a hot press to give a molded product. The molded product assumed a yellow color (originating from the color of the epoxy resin). However, it was translucent, permitting the uneven distribution of iron powder to be observed. It had a surface resistivity of $5\times10^{12}$ $\Omega/\square$, indicating that it does not have electrical conductivity high enough to prevent static build-up. Flexural tests indicated that the molded product has a flexural strength of 32.4 kg/mm$^2$ and a flexural modulus of 1948 kg/mm$^2$. A test piece (5 cm square) cut out of the molded product remained intact without delamination (due to thermal decomposition) when immersed in a soldering bath at 300° C. for 10 minutes.

COMPARATIVE EXAMPLE 4

The resin liquid prepared in Example 1 was further incorporated with 20 parts of "Dentol WK-208" and 5 parts of titanium oxide as electrically conductive fillers. The resin liquid was impregnated into a nonwoven fabric of glass fiber, with the ratio of the former to the latter being 30:70 by weight. The impregnated nonwoven fabric was pressed at 100° C. for 5 minutes using a hot press to give a prepreg in the B stage. A laminate of the prepregs was pressed 160° C. for 10 minutes to give a molded product. The molded product assumed a light grayish color. It had a surface resistivity of $2\times10^7$ $\Omega/\square$, indicating that it does not have electrical conductivity high enough to prevent static build-up. Flexural tests indicated that the molded product has a flexural strength of 30.9 kg/mm$^2$ and a flexural modulus of 1771 kg/mm$^2$. A test piece (5 cm square) cut out of the molded product suffered partial delamination near the edges when immersed in a soldering bath at 300° C. for 10 minutes.

COMPARATIVE EXAMPLE 5

The resin liquid prepared in Example 1 was further incorporated with 20 parts of "Dentol WK-208" and 5 parts of titanium oxide as electrically conductive fillers. The resin liquid was impregnated into a nonwoven fabric of glass fiber, with the ratio of the former to the latter being 15:85 by weight. The impregnated nonwoven fabric was pressed at 160° C. for 10 minutes using a hot press to give a molded product. The molded product was unsatisfactory due to incomplete impregnation near the edges. The well-impregnated central part of the molded product assumed a light gray color. The central part had a surface resistivity of $2 \times 10^5$ $\Omega/\square$, indicating that it has electrical conductivity high enough to prevent static build-up. Flexural tests indicated that the molded product has a flexural strength of 30.6 kg/mm² and a flexural modulus of 1780 kg/mm². A test piece (5 cm square) cut out of the molded product remained intact without delamination (due to thermal decomposition) when immersed in a soldering bath at 300° C. for 10 minutes.

COMPARATIVE EXAMPLE 6

A resin liquid was prepared by uniform mixing from the following components.

Epoxy resin ("DER331") . . . 100 parts
Acid anhydride hardener ("MT-500" from Nippon Kayaku) . . . 87 parts
Cure accelerator ("2E4MZ") . . . 1 part
Electrically conductive filler ("Dentol WK-208") . . . 10 parts
Titanium oxide . . . 5 parts The resin liquid was impregnated into a laminate of nonwoven fabrics of glass fiber, with the ratio of the former to the latter being 20:80 by weight. The impregnated laminate was pressed at 160° C. for 10 minutes using a hot press to give a molded product. Upon curing at 160° C. for 10 minutes, the resin composition used in this example gave a cured product having a glass transition point of 137° C.

The resulting molded product assumed a light grayish color. It had a surface resistivity of $2 \times 10^5$ $\Omega/\square$, indicating that it has electrical conductivity high enough to prevent static build-up. Flexural tests indicated that the molded product has a flexural strength of 35.5 kg/mm² and a flexural modulus of 1945 kg/mm². A test piece (5 cm square) cut out of the molded product remained intact without delamination (due to thermal decomposition) when immersed in a soldering bath at 300° C. for 10 minutes. The molded product was fabricated into a fastening pallet by machining in conformity with a printed circuit board, and the pallet was used for the automatic soldering of the printed circuit board. The printed circuit board suffered incomplete soldering at its center which is presumably due to the thermal deformation of the fastening pallet.

The results of Examples 1 to 3 and Comparative Examples 1 to 6 are collectively shown in Table 1.

TABLE 1

| Example (Comparative Example) | Surface resistivity ($\Omega/\square$) | Color | Heating test | Flexural strength (kg/mm²) | Flexural modulus (kg/mm²) | Performance of fastening pallet |
|---|---|---|---|---|---|---|
| 1 | $2 \times 10^5$ | gray | good | 37.7 | 1966 | good |
| 2 | $8 \times 10^5$ | white | good | 33.8 | 1850 | good |
| 3 | $8 \times 10^5$ | blue | good | 29.9 | 1722 | good |
| (1) | $1 \times 10^5$ | black | good | 34.7 | 1866 | — |
| (2) | $7 \times 10^8$ | gray | good | 24.6 | 1480 | — |
| (3) | $5 \times 10^{12}$ | yellow | good | 32.0 | 1948 | — |
| (4) | $2 \times 10^7$ | gray | poor | 30.9 | 1771 | — |
| (5) | $2 \times 10^5$ | gray | good | 30.6 | 1780 | — |
| (6) | $2 \times 10^5$ | gray | good | 35.5 | 1945 | poor |

It is noted from Table 1 that the light-colored electrically conductive plastic composite materials in Examples 1 to 3 are superior to those in Comparative Examples 1 to 6 in electrical conductivity (to prevent static build-up) and color (to permit coloring). In addition, the former are immune to delamination and deformation due to thermal deterioration and have good mechanical properties. They meet all the requirements for fastening pallets to be used to transfer printed circuit boards for their automatic soldering.

What is claimed is:

1. A solder resistant fastening pallet suitable to transfer printed circuit boards, comprising a fiber-reinforced plastic composite material, said composition material having a surface resistivity of from about $2 \times 10^5$ to $8 \times 10^5$, a flexural strength of from about 29.9 to 37.7 kg/mm², and a flexural modulus of from about 1,722 to 1,966 kg/mm², and being a thermosetting resin having incorporated therein 50–80 wt % reinforcing fibers and 5–90 parts by weight of an electrically conductive filler selected from the group consisting of $K_2Ti_8O_{17}$, $SnO_2$, $Sb_2O_3$, $Sb_2O_5$, $ZnO$, $TiO_2$ and mixtures thereof.

2. The fastening pallet as defined in claim 1, wherein the thermosetting resin is an epoxy resin which is liquid at room temperature before curing and has a glass transition point higher than 150° C. after curing.

3. A process for producing a fastening pallet as defined in claim 1, said process comprising impregnating a laminate of reinforcing fibers with a thermosetting resin liquid in which is dispersed said electrically conductive filler, followed by heating and pressing.

4. A process for producing a fiber-reinforced plastic composite material for fastening pallets as defined in claim 3, wherein the thermosetting resin is an epoxy resin which is liquid at room temperature before curing and has a glass transition point higher than 150° C. after curing.

* * * * *

UNITED STATES PATENT AND TRADEMARK OFFICE
CERTIFICATE OF CORRECTION

PATENT NO. : 5,573,843
DATED : November 12, 1996
INVENTOR(S) : Yutaka MITOH, et al.

It is certified that error appears in the above-indentified patent and that said Letters Patent is hereby corrected as shown below:

On the title page, in Item [75], the second inventor's name should read:

--Naoya Fujiwara--

Signed and Sealed this

Twenty-fifth Day of February, 1997

Attest:

BRUCE LEHMAN

*Attesting Officer*   *Commissioner of Patents and Trademarks*